United States Patent [19]
Horton, III

[11] Patent Number: 5,515,384
[45] Date of Patent: May 7, 1996

[54] METHOD AND SYSTEM OF FAULT DIAGNOSIS OF APPLICATION SPECIFIC ELECTRONIC CIRCUITS

[75] Inventor: Edward E. Horton, III, Westford, Vt.

[73] Assignee: International Business Machines Corporation, Armonk, N.Y.

[21] Appl. No.: 204,977

[22] Filed: Mar. 1, 1994

[51] Int. Cl.$^6$ ............................................. G01R 31/28
[52] U.S. Cl. .................... 371/22.4; 371/27; 371/22.5
[58] Field of Search ............................... 371/22.5, 22.4, 371/22.3, 23, 25.1, 27, 22.1; 364/578

[56] References Cited

U.S. PATENT DOCUMENTS

| | | | |
|---|---|---|---|
| 4,527,249 | 7/1985 | Van Brunt | 364/578 |
| 4,703,484 | 10/1987 | Rolfe et al. | 371/25 |
| 4,763,289 | 8/1988 | Barzilai et al. | 364/578 |
| 4,764,926 | 8/1988 | Knight et al. | 371/25 |
| 4,769,817 | 9/1988 | Krohn et al. | 371/23 |
| 4,901,259 | 2/1990 | Watkins | 364/578 |
| 4,949,341 | 8/1990 | Lopez et al. | 371/25.1 |
| 4,961,156 | 10/1990 | Takasaki | 364/578 |
| 5,146,460 | 9/1992 | Ackerman et al. | 371/23 |
| 5,177,440 | 1/1993 | Walker, III et al. | 324/158 R |
| 5,189,365 | 2/1993 | Ikeda et al. | 324/158 R |

OTHER PUBLICATIONS

Waicukauski, Linbloom; *Failure Diagnosis of Structured VLSI;* IEEE Design & Test of Computers; Aug., 1989; pp. 49–60.

Primary Examiner—Vincent P. Canney
Attorney, Agent, or Firm—Heslin & Rothenberg

[57] ABSTRACT

A complete fail signature for an integrated circuit is compared to at least one predicted fail signature generated using a hardware fault simulator to generate fault candidates for the integrated circuit representing the most likely faults present within the tested circuit or device. The complete fail signature may be generated by obtaining physical test data for the integrated circuit derived by testing the integrated circuit using test vectors and comparing the results of the testing with the test results of a flawless integrated circuit to generate a fail signature. Also, the complete fail signature may be generated by compiling the logic of the integrated circuit into binary language suitable for simulation in a hardware fault simulator and compiling the test vectors into binary language suitable for simulation in the hardware fault simulator. The logic function of the integrated circuit may be simulated on the hardware fault simulator and the test vectors applied to the hardware fault simulator to determine an expected output of the integrated circuit. The expected output may be combined with the fail signature to generate a complete fail signature representative of a complete output pattern of the integrated circuit.

27 Claims, 9 Drawing Sheets

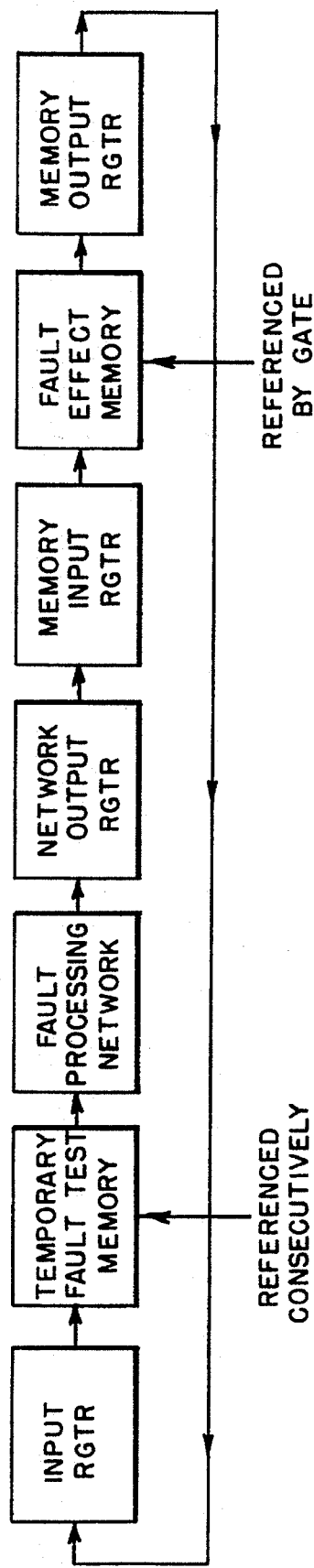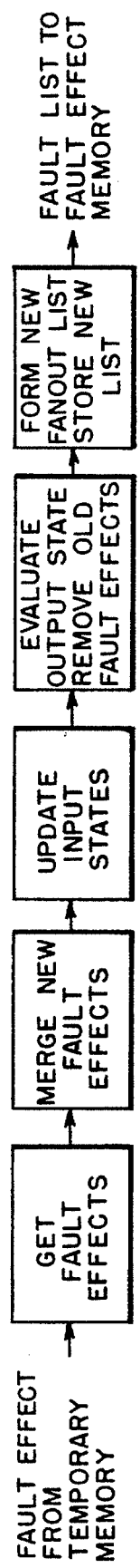
FIG. 3A
PRIOR ART
FIG. 3B
PRIOR ART

METHOD AND SYSTEM OF FAULT DIAGNOSIS OF APPLICATION SPECIFIC ELECTRONIC CIRCUITS

FIELD OF THE INVENTION

This invention pertains to the field of testing application specific integrated circuits, and more particularly to a method and system for diagnosing faults in an application specific integrated circuit.

BACKGROUND OF THE INVENTION

Continuing advances in the semiconductor industry have made possible the production of integrated circuits with increasingly larger numbers of logic or other elements on a single chip. The increasing complexity of application specific integrated circuits ("ASIC's") made possible by these advances and the high costs involved in initial production of a chip from a logic design have made logic simulation an important step in the chip design process. Logic simulation techniques are available in the art for simulating operation of a logic design for a chip prior to the start of fabrication of the chip, to uncover any operational errors therein, and to permit redesign as necessary before committing the design to chip fabrication. Various logic simulation computer programs are known in the art for performing this function. In addition, hardware logic simulators such as that disclosed in U.S. Pat. No. 4,769,817 issued on Sep. 6, 1988, provide highly efficient techniques for simulating and testing logic device designs.

A problem existing in the semiconductor industry is in the testing of manufactured chips. Even assuming a good, error-free logic design, it is well known that various faults and errors can enter into the production process which can result in functional defects in a manufactured chip. These faults can enter through a variety of causes in the numerous manufacturing process steps, and can affect any of the different gates, switches or lines on the chip. Although the causes of such errors are diverse, as a practical matter for testing purposes, they can be considered to occur on essentially a random basis anywhere in a chip. This presents a problem for production testing of chips, since for complex chips such as microprocessors or other integrated circuits there are so many circuit elements and combinations of inputs and outputs that it becomes impractical to test all possible input combinations against the known design standard to determine if a fault exists and to isolate the fault, if existing.

One current technique for determining if an application specific integrated circuit is faulty is to use a commercial integrated circuit tester to apply test vectors to a physical device and compare the resultant output of the device with simulated data representative of the flawless design of this same circuit. Using this technique, a faulty chip can be detected. However, the exact fault cannot be diagnosed without further testing of the integrated circuit.

Typically, a hardware fault simulator is used to determine if a given set of test vectors may be used to test for a defective chip. The hardware fault simulator is also used to simulate data output, or "signature", representative of a flawless integrated circuit which is compared to the actual physical test data, or "signature", of the integrated circuit to determine if a defect in the integrated circuit design exists. However, once a chip, or its design, has been tested as defective, it is difficult to determine the particular fault therein.

It is, therefore, desirable to develop a technique diagnosing faults in chips which locates the actual defect present within a defective integrated circuit design. It is also desirable to develop such a technique for diagnosing faults in an application specific integrated circuit which is capable of diagnosing such faults in circuits designed without the use of level sensitive scan design techniques.

SUMMARY OF THE INVENTION

The aforementioned goals may be achieved in accordance with the principles of the present invention. The invention includes a method for diagnosing faults in an application specific integrated circuit. The method includes comparing a complete fail signature for an integrated circuit to at least one predicted fail signature generated using a hardware fault simulator, and compiling fault candidates in the integrated circuit based upon the comparison.

The method may further include generating the complete fail signature by obtaining physical test data for the integrated circuit. Generating the physical test data for an integrated circuit may be accomplished by testing an integrated circuit using test vectors, comparing results of the testing with test results of a similar flawless integrated circuit to generate a fail signature.

The method may also include simulating the logic function of the integrated circuit on a hardware fault simulator and applying the test vectors to the hardware fault simulator to determine an expected output of the integrated circuit.

A complete fail signature may be obtained by compiling the logic of the integrated circuit into binary language suitable for simulation in a hardware fault simulator, and compiling the test vectors into binary language suitable for simulation in a hardware fault simulator.

The method may also include combining the expected output of the integrated circuit with the fail signature to generate a complete fail signature representative of a complete output pattern of the integrated circuit.

The method may also include generating a list of possible faults in the integrated circuit from the fail signature. Generating the list of possible faults may include tracing a cone of logic in reverse from one or more faulty output pins.

The method may further include simulating each possible fault in the list of possible faults on the hardware fault simulator to generate at least one predicted fail signature, each predicted fail signature corresponding to the predicted output of the integrated circuit having the simulated fault. The method may also include grading the fault candidates and reporting the fault candidates.

The method may be used for diagnosis of integrated circuits designed without the use of level sensitive scan design circuitry techniques.

The invention may also include a system for diagnosing faults in an application specific integrated circuit. The system may include means for comparing a complete fail signature for an integrated circuit to at least one predicted fail signature, and means for compiling fault candidates in said integrated circuit based upon the comparison.

The system may also include a means for generating the complete fail signature by obtaining physical test data for the integrated circuit. Obtaining the physical test data may be achieved by means for testing an integrated circuit using test vectors, and means for comparing results of said testing with test results of a similar flawless integrated circuit to generate a fail signature.

The system may also include means for compiling the logic of said integrated circuit into binary language suitable for simulation in a hardware simulator, and means for compiling the test vectors into binary language suitable for simulation in a hardware fault simulator.

The system may include means for simulating the logic function of the integrated circuit and a means for applying test vectors to determine an expected output of said integrated circuit.

The means for simulating the logic function of the integrated circuit may include a hardware fault simulator.

The system may also include means for combining the expected output of the integrated circuit with the fail signature to generate a complete fail signature representative of a complete output pattern of the integrated circuit.

The system may further include a means for generating a list of possible faults in the integrated circuit from the fail signature. The means for generating the list of possible faults may include a means for tracing a cone of logic in reverse from one or more faulty output pins.

The system may also include a means for grading the fault candidates and a means for reporting the fault candidates. The system may be capable of diagnosing a fault in an integrated circuit designed without the use of level sensitive scan design circuitry techniques.

BRIEF DESCRIPTION OF THE DRAWINGS

FIGS. 3A and 3B is a schematic block diagram illustrating the fault processing pipeline operation useable in the hardware fault simulator of FIG. 4;

DETAILED DESCRIPTION OF THE PREFERRED EMBODIMENT

In order to diagnose faults in an application specific integrated circuit in accordance with the principles of the present invention a hardware fault simulator should be used to simulate the logic of a device and/or faults which may be present within the device. As used herein, the term "device" or "chip" is intended to refer to an integrated circuit including application specific integrated circuits.

The Hardware Fault Simulator

A hardware fault simulator system is described in U.S. Pat. No. 4,769,817 issued on Sep. 6, 1988. U.S. Pat. No. 4,769,817 is incorporated herein by reference and made a part of the disclosure herein. Although, other hardware fault simulators which are capable of performing both logic simulation and fault simulation may be used, the invention will be described in reference to the aforementioned hardware fault simulator.

Figure 1:
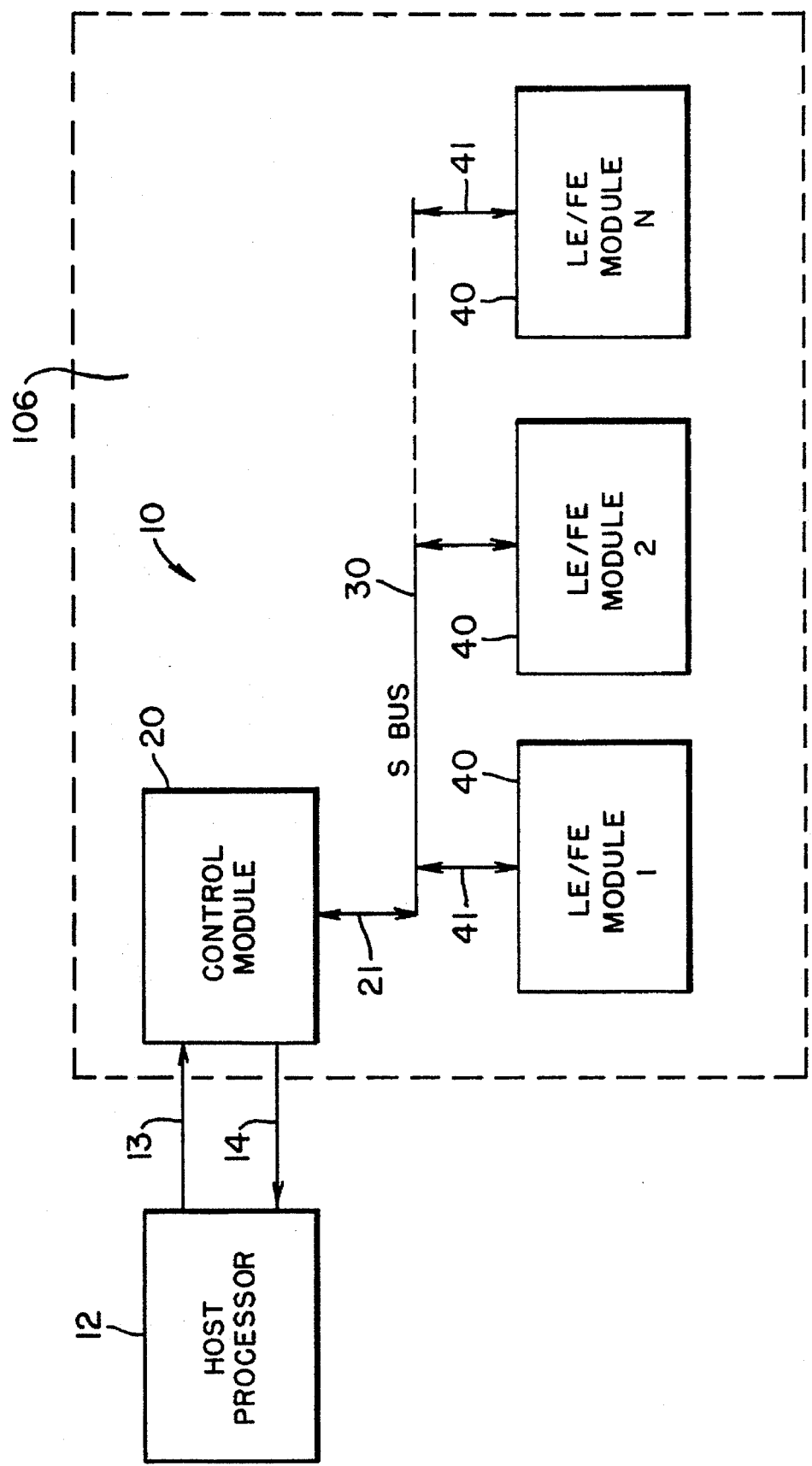
FIG. 1 is a generalized block diagram of a hardware fault simulator system useable in the present invention for simulating the logic and faults in an integrated circuit.

The hardware fault simulator including the host processor used to control the same is shown in FIG. 1. Referring to FIG. 1, host processor 12 is used for assembling and organizing the data describing the logic network design to be evaluated including types and operation of gates or other elements, interconnections, and design features. Host processor 12 also assembles information for all faults to be injected and simulated. Host processor 12 also assembles information for all test vectors to be applied via simulation. Once this data is passed to control module 20 over data path 13, the simulation process then proceeds under control of module 20. At the end of a simulation process, relevant data concerning logic and fault simulation developed during the process is passed back to host processor 12 over data path 14, where it can be analyzed and reviewed or, if necessary, modified for further processing runs.

Control module 20 communicates via data path 21 to a data bus 30 which is referred to as the simulation bus or S-bus. This bus in turn communicates to a number of logic evaluation/fault evaluation modules 40, which communicate therewith over data paths 41. A number of modules 40 can be provided, and in the preferred embodiment, from one to four of such modules may be used, depending upon the complexity of evaluation and speed of processing required. In other embodiments, a greater number than four could be used.

In operation, control module 20 sends event-driven/sample-time simulation data comprising test vector sets on the simulation bus 30 to modules 40, and issues commands to initiate simulation in modules 40.

The fault evaluation modules 40 may perform multiple functions. They may evaluate the logic of the design being tested to produce the simulation result, as is known in the art, for example generally as set forth in the previously mentioned U.S. Pat. No. 4,769,817, and in U.S. Pat. No. 4,527,249. In addition, modules 40 may perform concurrent fault simulation. The modules 40 contain additional logic and memory over that required for logic simulation, to store fault numbers corresponding to specific fault conditions being simulated, for storing fault states which correspond to the specific fault numbers, and for storing time and schedule information pertaining to faults at a gate which operates through a delay to create a fault input at other gates at a subsequent event sample time. Further memory and memory addressing logic are also provided for comparing a fault simulation to the logic simulation for a non faulty logic network for a given gate and fault number, and for updating and storing records of fault differences from the logical network simulation.

Figure 2A:
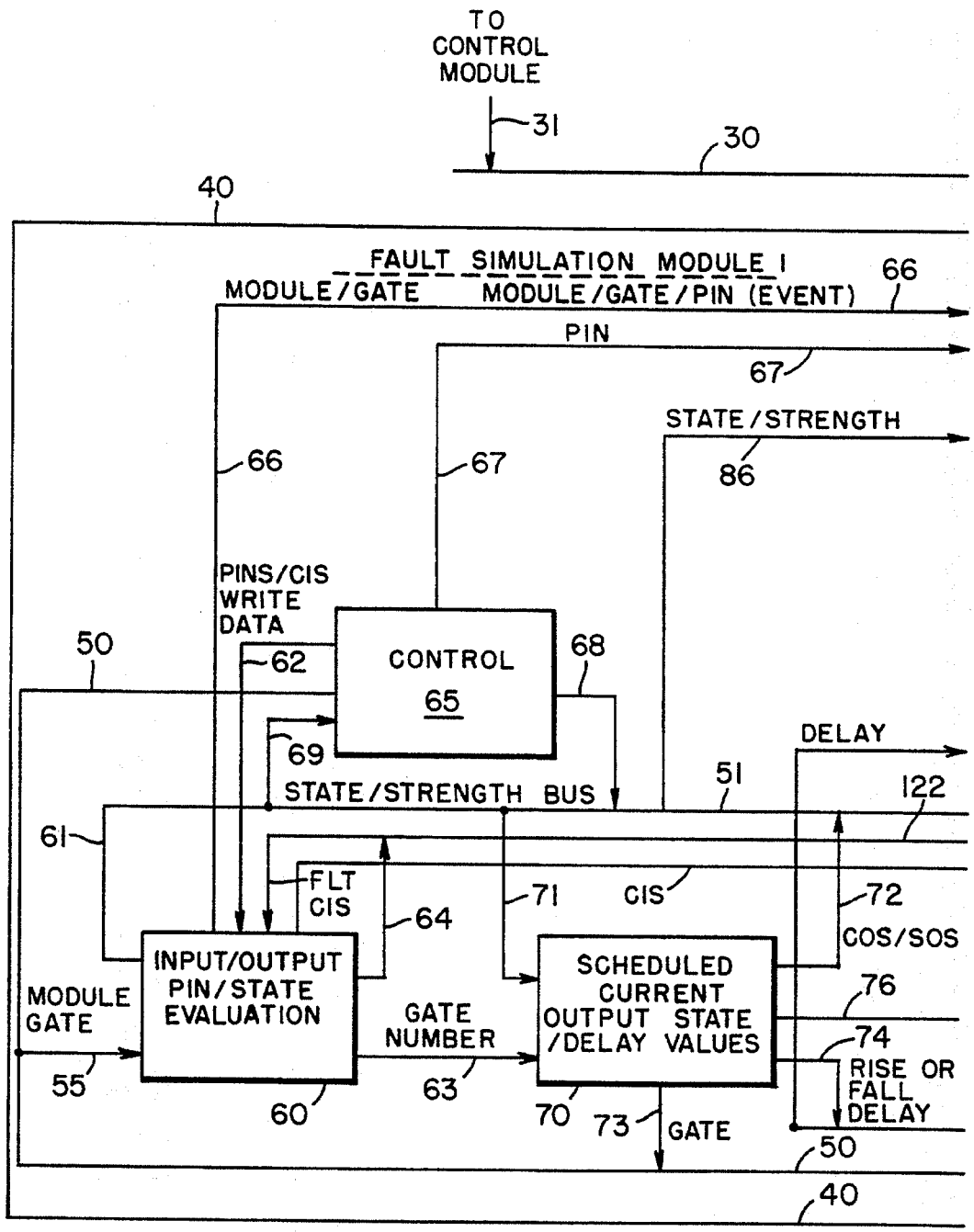
FIGS. 2A and 2B are a functional block diagram of one of a logic simulation/fault simulation modules of the hardware fault simulator of FIG. 1.
Figure 2B:
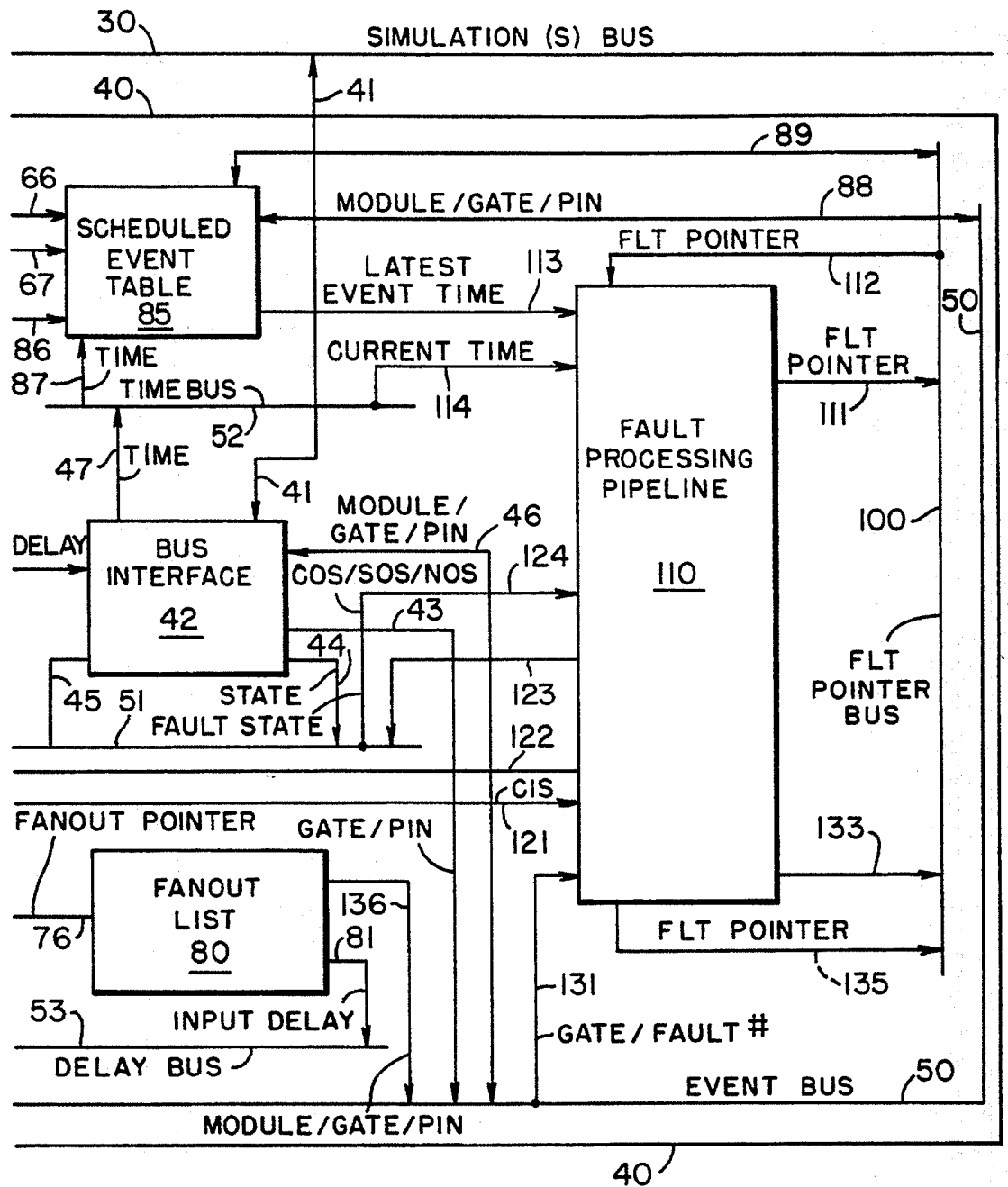

Referring now to FIGS. 2A and 2B, a fault evaluation module 40 is shown in greater detail, Data path 41 connects from the simulation S-bus 30 to a bus interface 42. Bus interface 42 also provides an output on data path 44 which provides state information to the state/strength bus 51. Data path 45 connects from bus 51 back to bus interface 42 for transmission to the S-bus. Data path 46 conveys module, gate and pin information from event bus 50 back to interface 42 for transmission back to the S-bus. Interface 42 also connects via data path 47 to a time bus 52.

Event bus 50 is connected by data path 55 to provide module and gate information to input pin/output state evaluation block 60. Functional block 60 also receives an input on data path 61 from state/strength bus 51, and an input on data path 62 from control 65, which provides pin and current input state write data. The pin/state update block 60 provides an output on data path 63 to provide gate number information to the scheduled current output/delay block 70. Block 60 also provides an output on path 64 to the state/strength bus 51, and an output on path 66 which provides module and gate number information to the scheduled event table 85. Control 65 also provides pin number information on data path 67 to scheduled event table 85. Control 65 also communicates with state/strength bus 51 on data paths 68 and 69.

The scheduled, current output/delay block 70 receives data from state/strength bus 52 over data path 71, and communicates therewith to provide current output state and scheduled output state information via data path 72. It also provides gate number output data on data path 73 to event bus 70, and rise or fall delay data on data path 74 which connects to delay bus 53. In addition, block 70 provides fanout pointer information on data path 76 to fanout list 80. Fanout list 80 includes a pair of outputs, one of which connects on data path 81 to provide input delay information to delay bus 53. The other output provides fanout gate number, pin number, and module number information on data path 136 to event bus 50.

Scheduled event table 85 additionally receives state/strength input information on data path 86, and receives time information from time bus 52 via data path 87. Scheduled event table 85 also provides module, gate and pin output information via data path 88 to the event bus 50, and communicates to and from fault pointer bus 100 via data path 89.

logic simulation

In operation, the system of FIG. 2 can perform logic simulation generally as follows. Control block 65 communicates with the various components to control the simulation process. Bus interface 42 receives and transmits data on the simulation bus 30, and also communicates to the other buses and components within the system. Input pin/output state evaluation block 60 updates the current input states of the gate or gates being simulated at a given event sample time, and produces a new output state from a truth table stored therein according to the type of logic gate. Scheduled current output/delay 70 updates the current output state for the gate supplied by state/strength bus 51, and also handles rise/fall data for delay-type gates. Block 70 also provides a fanout pointer to the fanout list block 80 for the particular gate number's net list. Fanout list 80 fans out the new state to all gates that are connected to the current gate being simulated via connection to event bus 50. Scheduled event table 85 keeps track of all delayed outputs and inputs to ensure that the corresponding delayed output is fanned out to the proper gates at the proper time in a subsequent event simulation. As in normal logic simulation, events are simulated in time samples successively throughout the design based on the logic design data information stored therein.

fault simulation

In addition to the logic simulation function outlined above, and concurrently therewith, the present invention provides for multiple concurrent fault simulation. For this purpose fault processing pipeline 110 is provided in FIG. 2. Block 110 communicates over data path 111 to provide fault pointer information to the fault pointer bus 100. Block 110 receives inputs from several sources, including fault pointer information on path 112 from fault pointer bus 100, latest event time information from timed event table 85 on data path 113, and current time information from time bus 52 on data path 114.

Fault processing pipeline 110 also receives current input state information via data path 112 from pin/state update block 60, and current, scheduled and new output state information from state/strength bus 51 via data path 124. Data path 123 provides fault output states to state/strength bus 51, and fault input pin states to block 60 via data path 122 in order to use the truth table of three input Boolean functions contained there. The resulting fault output state of the truth table returns to block 110 via data path 51 for fault processing (i.e., comparison with "good" gate states).

Fault processing pipeline 110 receives gate and fault number information from event bus 50 on data path 131. It also provides an output on data path 133 to pointer bus 100 and receives link or gate pointer information from fault pointer bus 100 on data path 135.

Generally, fault processing pipeline 110 and associated components function in conjunction with the other components to provide the concurrent fault simulation capability. Block 110 contains fault list memories to hold the fault numbers and fault states for each of the injected gate input pin or output pin faults which are to be run in the simulation. This information would include, for example, the identification of the gate and input or output thereof, and whether the fault effect was to have the pin stuck at a logical one or zero. This information is initially assigned and assembled in the host processor 12, based on the extent of fault simulation to be performed, and for a complete fault analysis, would include all possible faults for all inputs and outputs of all gates. This fault list information is sent to the control module 20 (FIG. 1), then loaded through the bus interface into block 110. Block 110 then holds the states information for the input and output pins of all gates exhibiting differences with the "good" counterparts for each fault number, and is selectively updated depending upon the results of the simulation of each fault number for each gate in the fault list memory, as the evaluation proceeds. Block 110 also holds in memory scheduled fault states and time information for subsequent fault simulations scheduled for a later time slice in the scheduled event table 85. Block 110 in effect operates to manage a fault effects list which is updated as the "good" logic network is being simulated and all faults on all corresponding gates are being simulated. The fault effects are determined by using the same hardware that the "good" logic network uses for its simulation. Thus, as normal logic evaluation proceeds, as a "good" gate is calculated and simulated by block 60, the corresponding fault numbers for that gate are similarly processed through, and the corresponding output states which are developed are compared against the good output for that gate, and if different, the fault outputs are updated and stored.

For any simulation that is executed, the states formation for inputs is retrieved from memory, the output solution for the gate is determined from the truth table, and the output is stored and fanned out to other affected gates. In addition, for every fault that is "found" on that gate, the fault states and outputs are determined and records updated in memory if different from the good logic network solution. The fault effects caused by the simulation events are also fanned out to subsequent gates by good simulation control 65 and fanout list 80. In the case of fault effects due to appear at a later time slice, a scheduled fault output state is scheduled into the scheduled event table 85 separate from the good output states scheduled there.

According to one feature of the invention, the fault memory in block 110 is designed for flexible allocation because, for different simulation jobs and at different points in a simulation, the amount of fault data can vary widely. Thus, in order to have the memory logically expandable and contractible in accordance with the number of fault effects for a given gate, the memory is designed to be able to access all faults for a particular gate quickly and efficiently to be able to put a used fault location in memory back to an unused status if the fault effect has been deactivated by a simulation event, and to provide pointer information identifying the next unused memory location for storing a fault at any time.

The fault memories may be organized in a pipeline structure to utilize greater speed in fault processing. In this pipeline the "good" logic network is solved by simulating the model according to the events on the input, and determining if there are events generated on the output which need to be fanned out to other gate models, thereby generating more events to be simulated in the other models.

The fault processing pipeline is used to solve the "fault" network event(s) for the same gate model as the "good" network is being solved. Each time an event occurs on the "good" logic network gate model, if a list of faults exist for that gate model, the "fault" network must be evaluated to determine if the "fault" network is different from the "good" network.

If the "fault" network simulation proves to be different there exists a "fault effect" which is considered an event generated for the "fault" network. These fault events must be fanned out to the other gate models just as the "good" network events are fanned out. If the "fault" network simulation proves not to be different from the "good" network there is no fault effect event to be fanned out.

The hardware fault processing pipeline concept is illustrated in FIGS. 3A and 3B. The pipeline is designed to maintain current fault effect lists for gates as an event occurs for that gate.

The fault effects memory holds the fault list for a given gate. When there is an event for that gate, the process of updating the fault list begins. All the faults for that gate are retrieved and placed in the temporary fault list memory. Once the fault list is in the temporary memory, the faults are processed consecutively in the fault processing network which is shown in greater detail in FIG. 3B. The updated fault list is then prepared for fanout and placed back in the fault effects memory.

FIG. 3B shows the fault processing network. The functions performed in this network use the hardware of the fault processing pipeline and the good logic network truth table.

From the list of faults in the temporary fault list memory a fault effect is obtained. If this is a new fault it is then merged into the existing fault list. The input state of the "fault" network is then updated, if necessary. The output state of the "fault" network must then be evaluated by using the "good" network's truth table to obtain a "fault" network output state. If the "good" network output state and the "fault" network output state are alike, the fault effect is removed from the list. If the two are different a new fanout list is formed and stored.

By segmenting the fault processing network into specific hardware functions the fault list can be processed faster. As a fault is retrieved from the list and leaves the merge new fault segment, the next fault in the list is retrieved and started in the same segment. At any point in time there would be several faults in various stages of process through the pipeline, according to the function of the particular segment.

The detailed configuration and operation of one fault processing module and particularly of fault processing pipeline 110 of FIG. 2 is more particularly set forth in U.S. Pat. No. 4,769,817, which is incorporated by reference and made a part of the disclosure herein.

Fault Diagnosis of Application Specific Integrated Circuits

Figure 4:
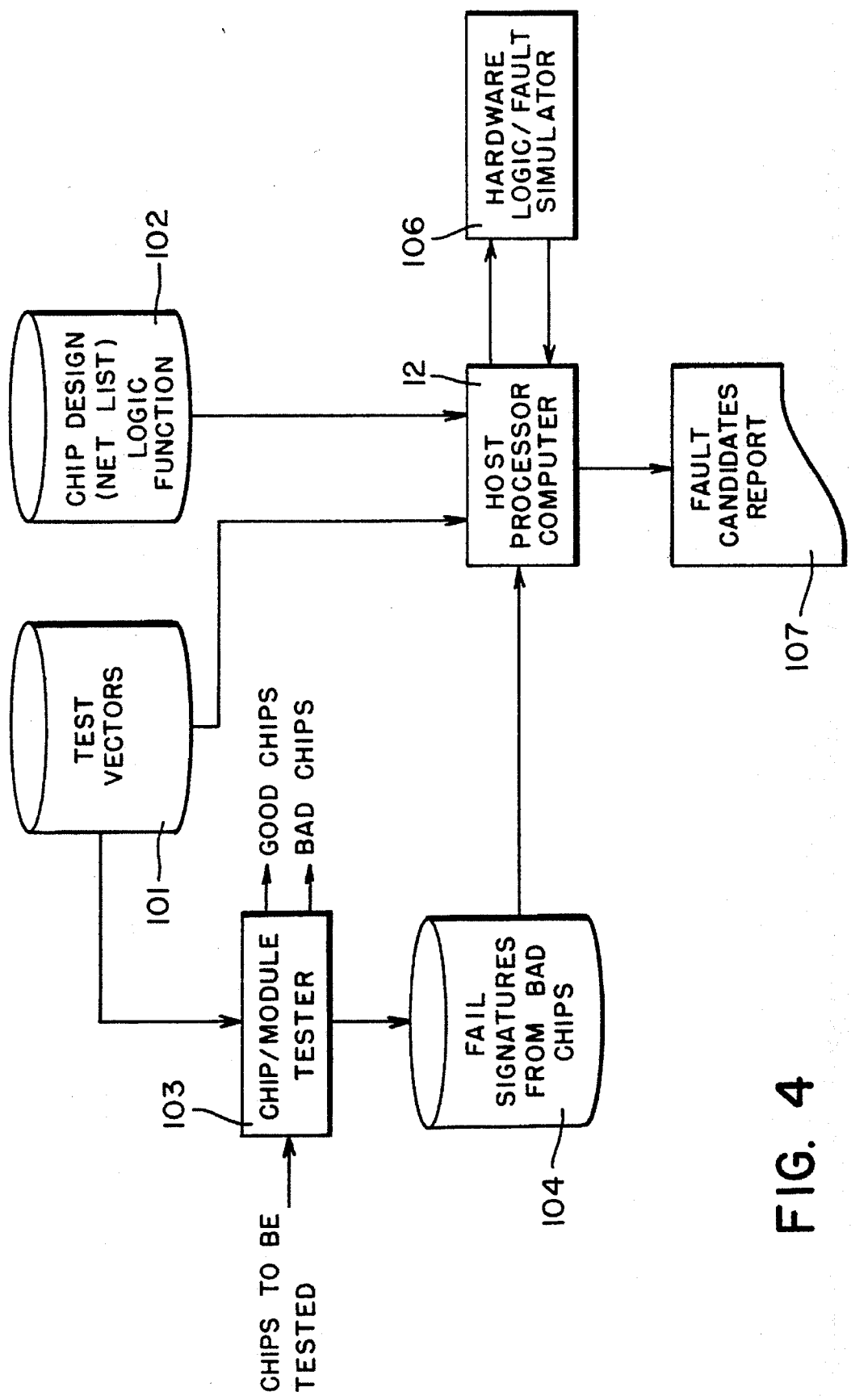
FIG. 4 is a generalized block diagram showing the fault processing system used to diagnose faults in an application specific integrated circuit in accordance with the principles of the present invention.

The fault diagnosis of application specific integrated circuits may be performed in accordance with the principles of the present invention using the system represented in FIG. 4. Using such a system to perform the process represented in the flow charts of FIGS. 7A and 7B, fault diagnosis of devices designed without the use of level sensitive scan design ("LSSD") techniques may be performed. The system and process may also however be used on LSSD devices as well.

Referring to FIG. 4, the host computer 12 is interfaced with the hardware fault simulator 106, as referred to in FIG. 1 and discussed supra. The host computer 12 receives fail signatures from a chip/module tester 103. The host computer 12 then generates a "complete fail signature" and compares this with a "predicted fail signature" generated by the hardware fault simulator 106 to produce a potential fault report 107 indicating "fault candidates" for the integrated circuit.

Referring to the flowcharts indicated at FIGS. 7A and 7B, the fault diagnosis of application specific integrated circuits performed using the system depicted in FIG. 4 will now be described. A physical device is initially tested using a conventional chip tester. Various commercially available chip testers are well known in the art. As is also well known in the art, a chip is tested using test vectors supplied by the designer of the particular device. The test vectors represent signal values to be applied to the input pins of an integrated circuit at particular time intervals as well as signal values expected to be generated as output by the device at particular instances in time as a result of the applied input signals. The testing of the chip includes the application of input signals and the measuring of output signals at different time intervals. During the testing of the physical device, the output values produced by the device during the test are monitored. These measured output values may be then be compared with the expected output values set forth in the test vectors. If at any instance in time a measured output signal value differs from the expected output signal value set forth in the test vectors, the expected output should be recorded, along with the measured output, and the time interval at which the output was measured. These parameters constitute the "fail signature" of a flawed device.

Referring to FIG. 4, the test vectors are entered into the chip tester 103 which applies the test vectors and determines which devices constitute good chips or bad ("flawed") chips. For a flawed chip, the fail signatures 104 obtained from the testing of the chip are then compiled and sent to host computer 12. Using the logic model of the device ("device logic model"), the description of the logic function of the device should be compiled to create a compiled model of the logic function ("compiled logic model") (see FIG. 7A). The logic model of the device may be compiled into a source code or a binary language such as Electronic Design Interchange Format ("EDIF") suitable for use in the hardware fault simulator 106.

The test vectors 101 (FIG. 4) should be compiled into a source code to be placed in a binary language such as The Wave Form Generation Language (WGL) of Test System Strategies, Inc. (TSSI) suitable for use in the hardware fault simulator 106. The compiled test vectors may then be used, as described herein, to determine the expected outputs of the logic device if not flawed and/or to simulate faults within such a device on the hardware fault simulator. The expected outputs of the non flawed logic device may be used to generate a "complete fail signature" described herein. The simulated faults may be used to generate "predicted fail signatures".

Figure 6:
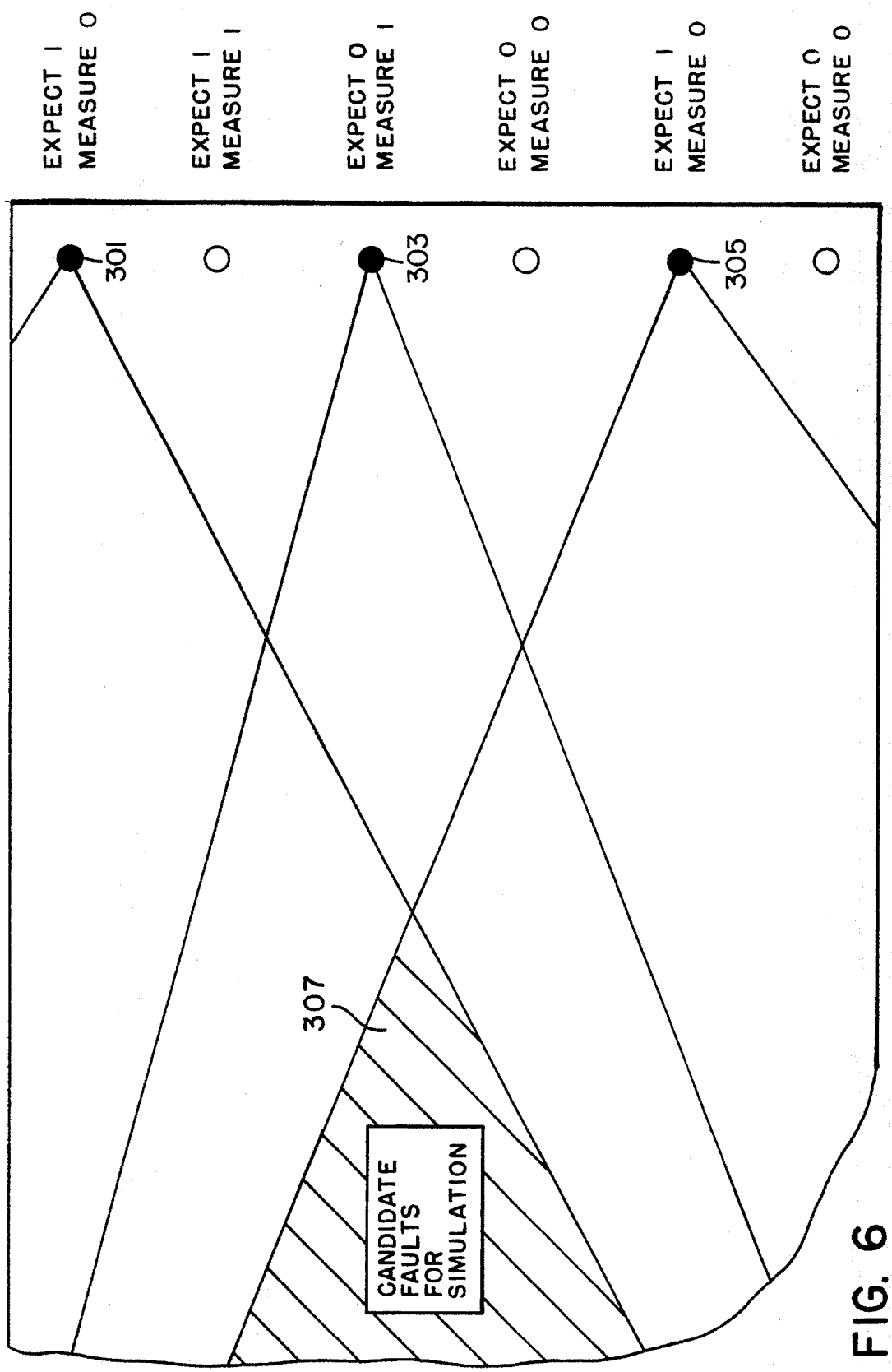
FIG. 6 is a schematic representation of a technique for generating a list of possible faults in a device in accordance with the principles of the present invention.
Figure 7A:
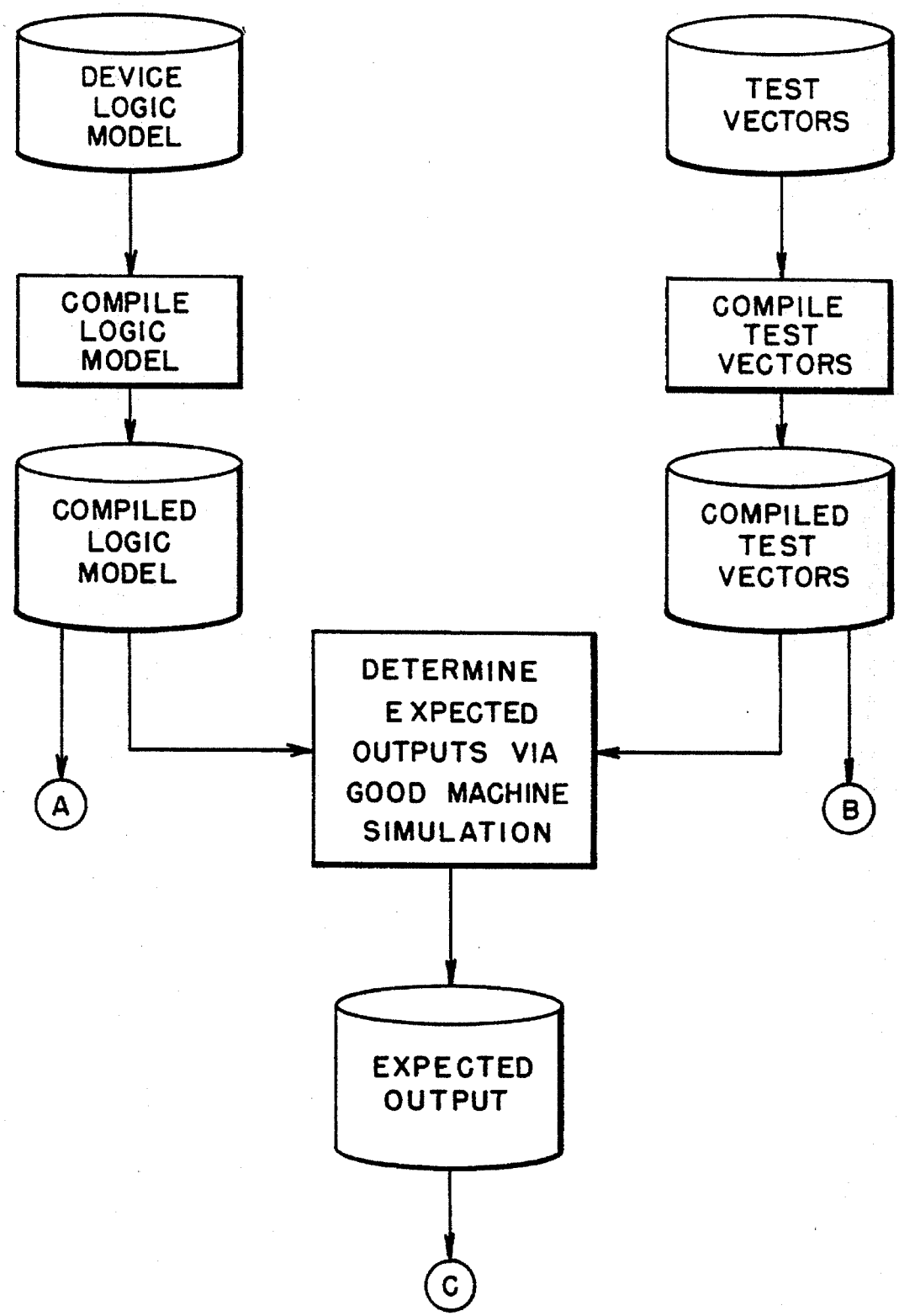
FIGS. 7A and 7B depict a flowchart illustrating the operation of the present invention.
Figure 7B:
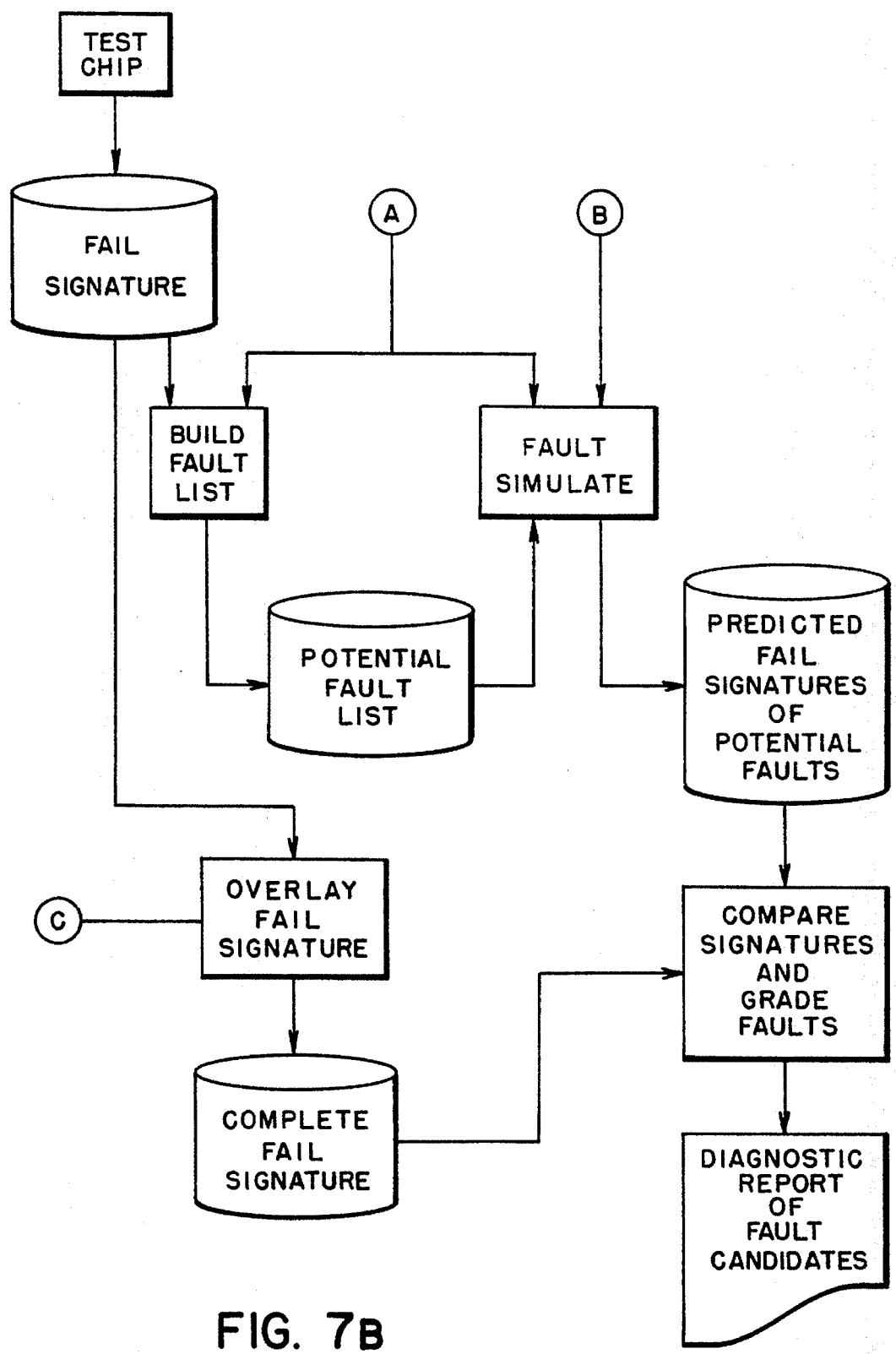

Referring to FIG. 7A and 7B, a list of potential faults in the tested device ("potential fault list") which is to be analyzed by simulation on the hardware fault simulator is created. In accordance with the principles of the present invention. The list of potential faults will constitute a series of hypothesis which will be proved or disproved through the simulation of the device. The list may be created by merely recording all the possible individual faults on the device. Alternatively, however, the list of potential faults may be generated from the fail signature 104 obtained as a result of the testing of the chip or device on the chip tester 103. Using this technique and referring to FIG. 6, each failing output pin 301, 303, 306 observed in the fail signature is isolated. The logic design of the device leading to the failed output pins 301, 303, 305 is traced back to produce a cone of logic from each failed pin. The common region 307 in all the cones of logic represents the region of logic where the possible faults exists. The cones of logic are therefore intersected to consider the logic that could have influenced the output pin to generate an improper output. All possible faults within the common region 307 at the intersection of the cones of logic then may comprise the list of possible faults ("potential fault list").

Referring to FIG. 7A, the compiled test vectors and compiled logic model are used to determine the "expected output" of the tested device. In essence, the expected output represents the output generated by simulating the logic of a non-faulty device. The expected output represents output values of the device and may be extracted from the output values of the test vectors. However, in accordance with the principles of the present invention the hardware fault simulator 106 may be used to determine the expected output by simulating the logic model of the device using the compiled test vectors for the particular device tested. The actual technique for logic simulation by the hardware fault simulator 106 is described supra and in U.S. Pat. No. 4,769,817.

The host computer 12 may utilize expected output generated by the hardware fault simulator 106 to obtain a "complete fail signature". Referring now to FIG. 7A and 7B, the host computer combines or overlays the fail signature generated by testing the device with the expected outputs to generate a "complete fail signature" representative of a complete output pattern of the integrated circuit. The host computer overlays the observed values of the failing pins on the tested integrated circuit, as indicated by the fail signature, on the expected outputs to create a complete fail signature. The complete fail signature differs from the fail signature generated by testing the integrated circuit. The complete fail signature includes the correct output of the tested circuit combined with the incorrect output while the fail signature may include only the incorrect output for particular time intervals. The complete fail signature may, however, be obtained directly from the tested device without the use of the hardware fault simulator. Also, the complete fail signature may be combined or overlayed using the multiplexor configuration set forth in FIG. 5.

If a hardware fault simulator such as that described herein and in U.S. Pat. No. 4,769,817 is used in the present invention, the logic function of the device when compiled may be altered in order to allow comparison between a flawed design of the logic device and the fail signatures of the tested device. The modifications to the logic of the device may be performed as set forth in FIG. 5.

As an alternative to modifying the logic function of the tested device, the hardware fault simulator 106 described herein and in U.S. Pat. No. 4,769,817 could be modified. Moreover, the software controlling the hardware fault simulator could also be modified to allow the comparison between the fail signature and predicted fail signatures.

Figure 5:
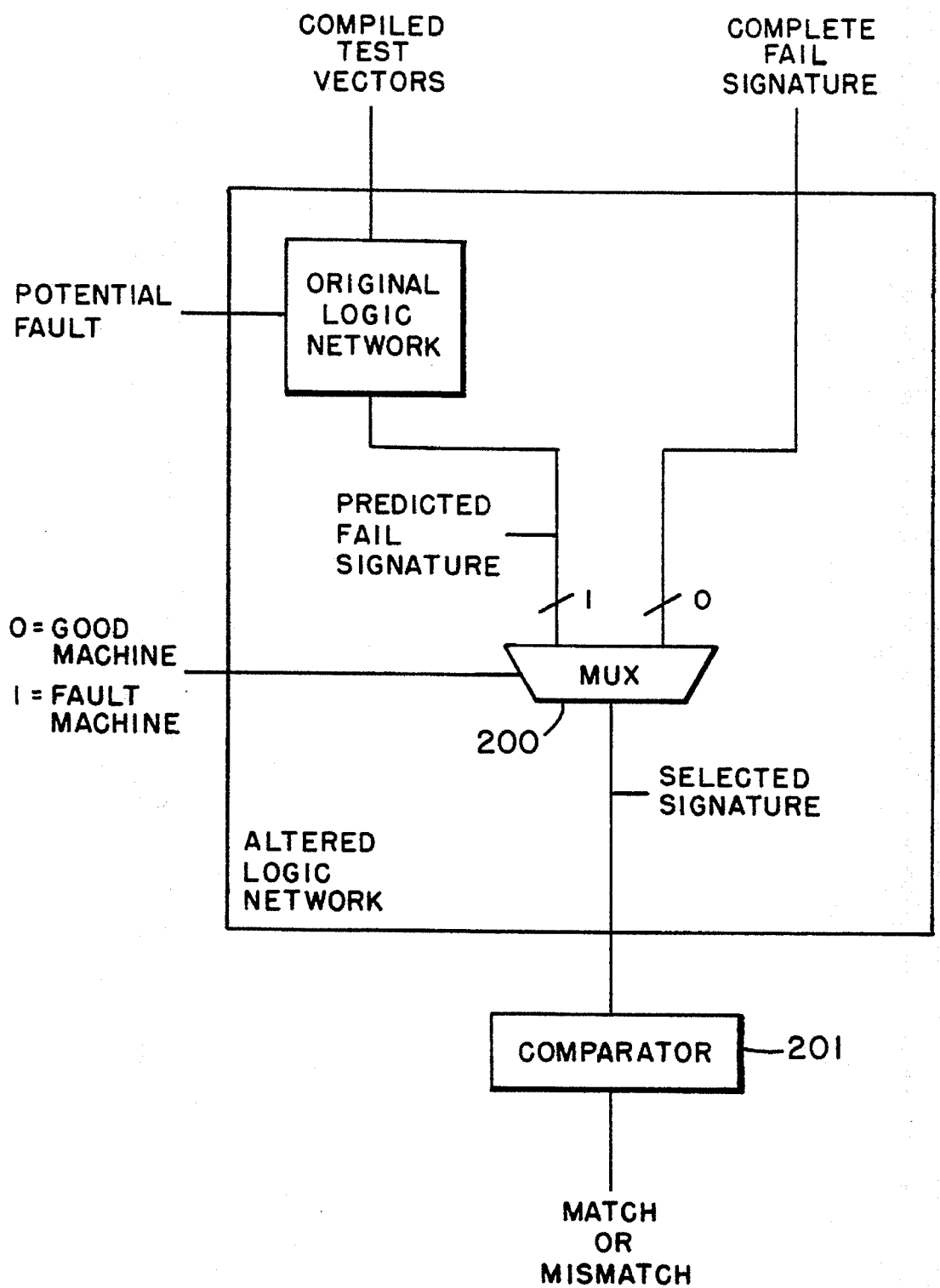
FIG. 5 is a schematic block diagram of a means for causing a hardware fault simulator to compare predicted fail signatures with a complete fail signature without modifying the hardware of the hardware fault simulator.

Referring to FIG. 5, a comparator 201, typically located within the hardware fault simulator 106 (FIG. 1), is designed to compare the "predicted fail signatures" representing the output of each simulated fault in the device against the expected output of the good or flawless device simulated at the same time. Since the same hardware is simulating the good device having a flawless network and a faulty device depicting a faulty network, the comparator 201 first requests the expected output or signature of the good device. The comparator 201 then switches to a fault mode and requests the output states or signature of a faulty device.

The present invention involves a comparison of a "predicted fail signature" with a "complete fail signature". To accomplish this, a multiplexor 200 is inserted in the logic network to be simulated at each output. With the multiplexor 200 inserted, the actual output states provided to the comparator 201 when it requests the good machine states will be the complete fail signature. The good machine outputs are ignored. Then in fault machine mode, the actual simulated "predicted fail signature" will be provided to the comparator 201 by the multiplexor 200 as usual. As more fully described herein, the predicted fail signature is obtained by simulating the original logic network design of the tested device having a potential fault therein using the compiled test vectors.

Use of the multiplexor technique is one way to effect the desired comparison. Other comparison techniques may be used and the invention is not limited to any particular comparison technique. Use of the multiplexor may effectuate the modifications required to be made in the logic network to be simulated without changes in the circuitry of the hardware fault simulator described herein.

Referring to FIGS. 7A and 7B, the hardware fault simulator 106 then simulates the faults on the "potential fault list" using the "compiled logic model" of the integrated circuit and the "compiled test vectors" to generate a predicted fail signature representative of the output of the integrated circuit if the fault indicated on the list of possible faults were present on the tested device. A "predicted fail signature" for each possible fault on the list of possible faults is generated. The predicted fail signatures of the potential faults may then be compared by the comparator 201 (FIG. 5) with the "complete fail signature" obtained from the tested physical device. Those predicted fail signatures that more closely resemble the complete fail signature will generally represent the most likely fault candidates which represent the actual fault on the tested device.

Many grading techniques may be used to generate the fault candidates based on comparing each predicted fail signature with the complete fail signature. In the preferred grading technique, the percentage of device outputs that are in the same state in the predicted fail signature and the complete fail signature are recorded for each potential fault. Assuming a single stuck fault model, these percentages are then sorted with those faults with 100% of outputs matching at the top of the list. These are the potential faults that are most likely to be the cause of the defect on the tested physical device. An extension of this method keeps separate match percentages for the device outputs that failed at the tester (described in the original fail signature) and those that passed (had the expected value) at the tester. It is then possible to rank a potential fault that matches 100% of the failed outputs and less than 100% of the passed outputs higher than a potential fault that matched less than 100% of the failed outputs even if they had the same overall percentage of matched outputs. In practice, this is desirable.

In other grading techniques, it may be possible to identify more than one potential fault. The union of fault effects may represent a combined predicted fail signature which may be matched with the complete fail signature to determine multiple stuck faults.

More sophisticated analysis of the predicted fail signatures in combination with the complete fail signature, may also yield information useful in the diagnosis of bridging faults (on device wire to wire shorts). The fault candidates may be reported in a diagnostic report to support the physical failure analysis of the tested device.

Diagnostic fault simulators known in the art require the devices to be diagnosed to be designed following the Level Sensitive Scan Design (LSSD) design methodology. The present invention makes use of a hardware fault simulator 106 capable of simulating devices designed without the LSSD restrictions (i.e., Non-LSSD or sequential). Due to the capabilities of the Non-LSSD hardware fault simulator, it is now practicable to perform diagnosis of LSSD and Non-LSSD designed devices according to the method and system of the present invention.

Although the invention has been described in conjunction with the embodiments set forth herein, it is apparent to one skilled in the art that various modifications to the system and techniques set forth herein may be made without departing from the essence of the invention. Any such modifications are intended to be within the scope of the invention as defined in the following claims.

What is claimed is:

1. A method for diagnosing faults in an application specific integrated circuit comprising:
   comparing a complete fail signature for an integrated circuit to at least one predicted fail signature generated using a hardware fault simulator; and
   compiling fault candidates in said integrated circuit based upon said comparing step.

2. The method of claim 1 wherein an expected output of a flawless version of said integrated circuit is combined with a fail signature to generate said complete fail signature representative of a complete output pattern of said integrated circuit.

3. The method of claim 1 further comprising generating said complete fail signature by obtaining physical test data for said integrated circuit.

4. The method of claim 3 wherein obtaining physical test data for an integrated circuit to generate a complete fail signature for said integrated circuit is accomplished by:
   testing said integrated circuit using test vectors; and
   comparing results of said testing with test results of a similar flawless integrated circuit to generate said fail signature.

5. The method of claim 3 wherein obtaining physical test data for an integrated circuit to generate a complete fail signature further comprises:
   compiling the logic of said flawless integrated circuit into binary language suitable for simulation in a hardware fault simulator; and
   compiling said test vectors into binary language suitable for simulation in a hardware fault simulator.

6. The method of claim 5 wherein said expected output of said integrated circuit is obtained by simulating the logic function of said flawless integrated circuit on said hardware fault simulator and applying said test vectors to said hardware fault simulator.

7. The method of claim 3 or 5 further comprising generating a list of possible faults in said integrated circuit.

8. The method of claim 7 wherein generating said list of possible faults comprising tracing a cone of logic in reverse from one or more faulty output pins of said fail signature.

9. The method of claim 7 further comprising simulating each possible fault of said list of possible faults on said hardware fault simulator to generate at least one or more predicted fail signature, each predicted fail signature corresponding to the predicted output of said integrated circuit having said simulated fault.

10. The method of claim 9 further comprising grading said fault candidates.

11. The method of claim 9 further comprising reporting said fault candidates.

12. The method of claim 1 wherein comparing said complete fail signature is for an integrated circuit designed without the use of level sensitive scan design circuitry techniques.

13. A method of diagnosing faults in an application specific integrated circuit comprising:
   combining an expected output of an integrated circuit with a fail signature for said integrated circuit to create a complete fail signature for said integrated circuit;
   simulating possible faults on a hardware fault simulator to create at least one predicted fail signature, each predicted fail signature corresponding to the predicted output of said integrated circuit having a particular fault therein;
   comparing each predicted fail signature with said complete fail signature to generate a list of possible fault candidates in said integrated circuit.

14. A system for diagnosing faults in an application specific integrated circuit comprising:
   means for comparing a complete fail signature for an integrated circuit to at least one predicted fail signature; and
   means for compiling fault candidates in said integrated circuit based upon said comparing step.

15. The system of claim 14 further comprising means for generating said complete fail signature by obtaining physical test data for said integrated circuit.

16. The system of claim 15 further comprising:
   means for testing an integrated circuit using test vectors; and
   means for comparing results of said testing with test results of a similar flawless integrated circuit to generate a fail signature.

17. The system of claim 16 further comprising:
   means for compiling the logic of said integrated circuit into binary language suitable for simulation in a hardware simulator; and
   means for compiling said test vectors into binary language suitable for simulation in a hardware fault simulator.

18. The system of claim 16 further comprising means for simulating the logic function of said integrated circuit.

19. The system of claim 18 further comprising means for applying test vectors to determine an expected output of said integrated circuit.

20. The system of claim 19 wherein said means for simulating the logic function of said integrated circuit comprises a hardware fault simulator.

21. The system of claim 20 further comprising means for combining the expected output of said integrated circuit with said fail signature to generate a complete fail signature representative of a complete output pattern of said integrated circuit.

22. The system of claim 21 further comprising means for generating a list of possible faults in said integrated circuit.

23. The system of claim 22 wherein said means for generating said list of possible faults comprises means for tracing a cone of logic in reverse from one or more faulty output pins of said fail signature.

24. The system of claim 22 further comprising means for grading said fault candidates.

25. The system of claim 22 further comprising means for reporting said fault candidates.

26. The system of claim 14 wherein said means for comparing said complete fail signature for an integrated circuit is capable of comparing the complete fail signature of an integrated circuit designed without the use of level sensitive scan design circuitry techniques.

27. A system of diagnosing faults in an application specific integrated circuit comprising:

means for combining an expected output of an integrated circuit with a fail signature for said integrated circuit to create a complete fail signature for said integrated circuit;

means for simulating possible faults to create at least one predicted fail signature, each predicted fail signature corresponding to the predicted output of said integrated circuit having a particular fault therein;

means for comparing each predicted fail signature with said complete fail signature to generate a list of possible faults in said integrated circuit.

* * * * *